United States Patent [19]

Ryat

[11] Patent Number: 5,446,457
[45] Date of Patent: Aug. 29, 1995

[54] CURRENT-SUMMING DIGITAL-TO-ANALOG CONVERTER WITH BINARILY WEIGHTED CURRENT SOURCES

[75] Inventor: Marc H. Ryat, Fort Collins, Colo.

[73] Assignee: SGS-Thomson Microelectronics, Inc., Carrollton, Tex.

[21] Appl. No.: 197,211

[22] Filed: Feb. 16, 1994

[51] Int. Cl.[6] ............................................. H03M 1/78
[52] U.S. Cl. ................................. 341/136; 341/153
[58] Field of Search ............... 341/136, 144, 153, 154; 323/316

[56] References Cited

U.S. PATENT DOCUMENTS

| | | | |
|---|---|---|---|
| 4,393,370 | 7/1983 | Hareyama | 341/136 |
| 4,725,813 | 2/1988 | Miyada | 307/571 |
| 4,800,365 | 1/1989 | White et al. | 341/119 |
| 5,008,671 | 4/1991 | Tuthill | 341/136 |
| 5,010,337 | 4/1991 | Hisano et al. | 341/154 |
| 5,070,331 | 12/1991 | Hisano | 341/154 |
| 5,148,164 | 9/1992 | Nakamura et al. | 341/136 |
| 5,293,166 | 3/1994 | Ta | 341/118 |

Primary Examiner—Marc S. Hoff
Attorney, Agent, or Firm—Richard A. Bachand; Joseph Arrambide; Lisa K. Jorgenson

[57] ABSTRACT

A digital-to-analog converter has a bias block that provides first and second voltage outputs, and a bit cell having a switch for selectively connecting either a first or a second summing node to a current flow path depending upon the state of a binary input signal. An output bipolar transistor and a current source are connected in series between a supply voltage and a reference potential. A first MOS transistor is connected in the current flow path with its gate connected to the bipolar transistor. A base current compensating second MOS transistor is connected between the supply voltage and a base of the output bipolar transistor with its gate connected to the first voltage output of the amplifier. A resistor is connected between the base of the output bipolar transistor and the second voltage output of the amplifier. When a plurality of bit stages are provided, the resistor of each of the plurality of bit cells is sized according to a position of its associated cell in the bit order. The resistors may be sized as a power of 2 according to a position of its associated cell in the bit order, or, except for a most significant bit cell may be sized 2 times larger than the resistor of the most significant bit cell, with a plurality of equally sized resistors connecting adjacent bit cells in an R-2R network.

33 Claims, 6 Drawing Sheets

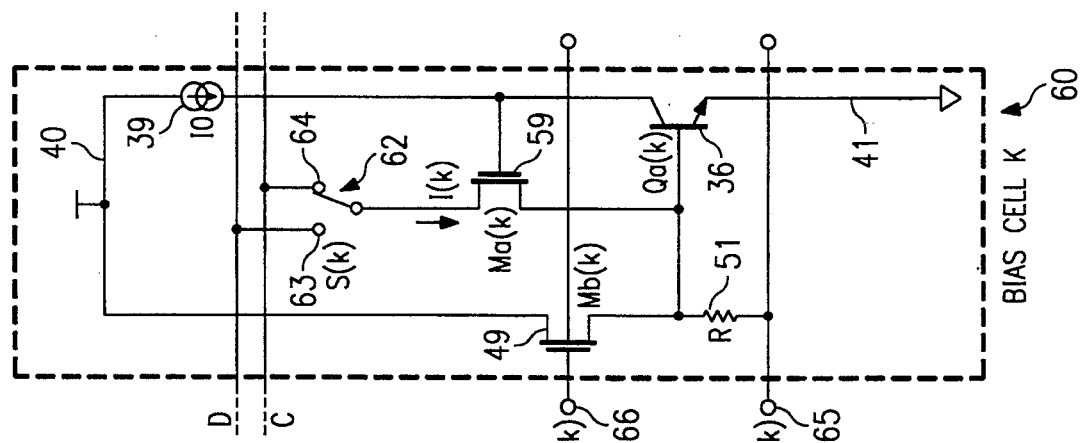
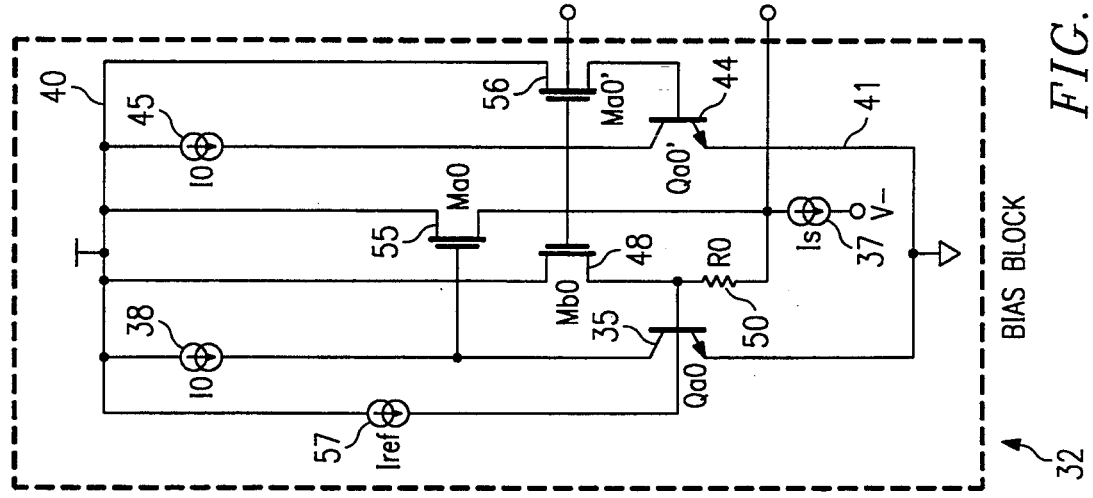
FIG. 3
FIG. 2

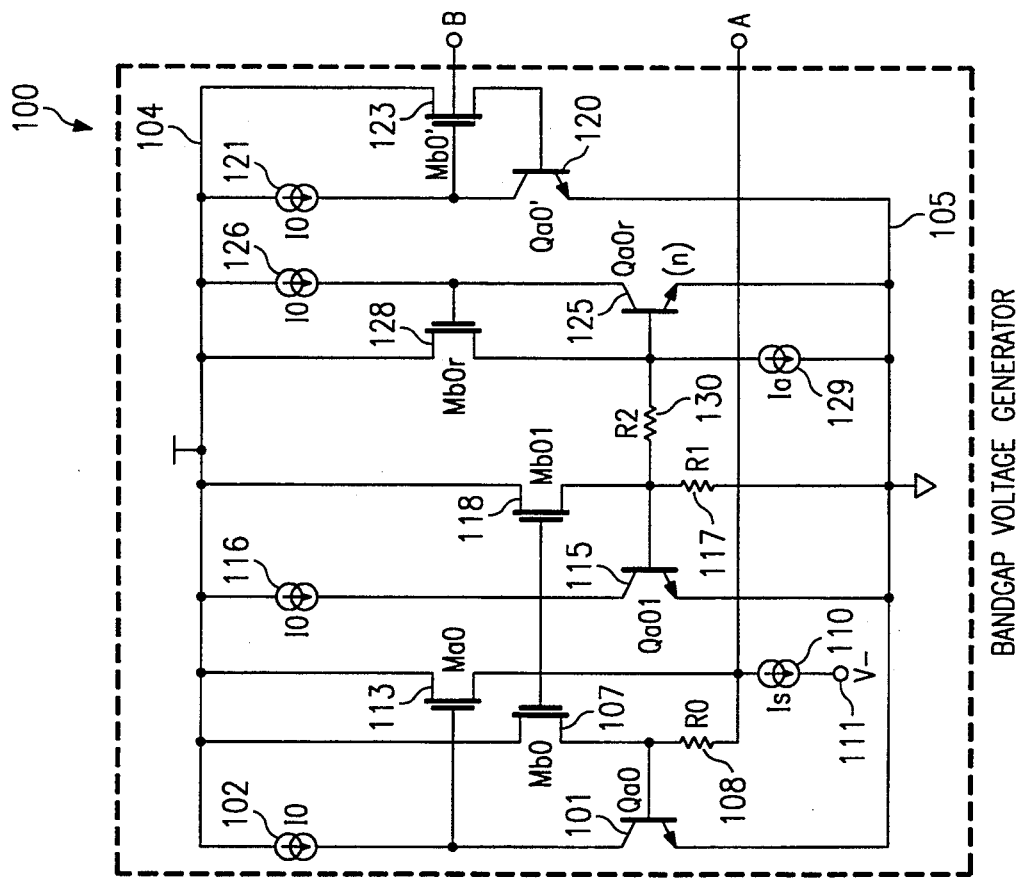
FIG. 5 BANDGAP VOLTAGE GENERATOR
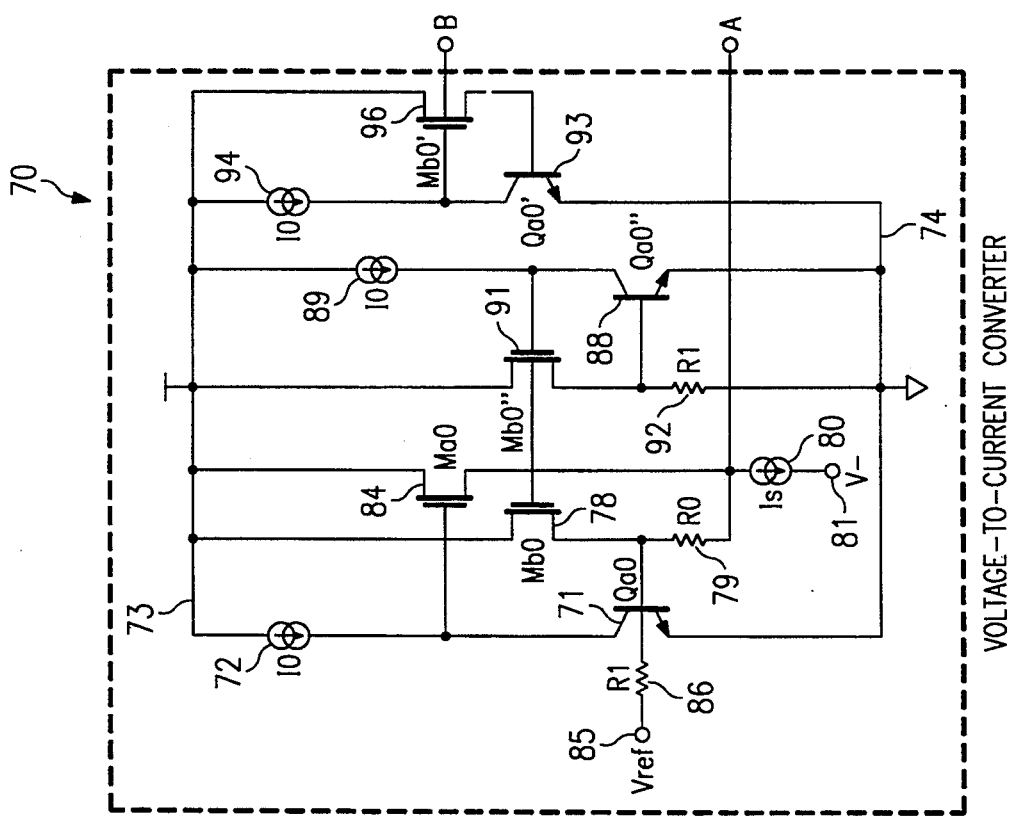
FIG. 4 VOLTAGE-TO-CURRENT CONVERTER

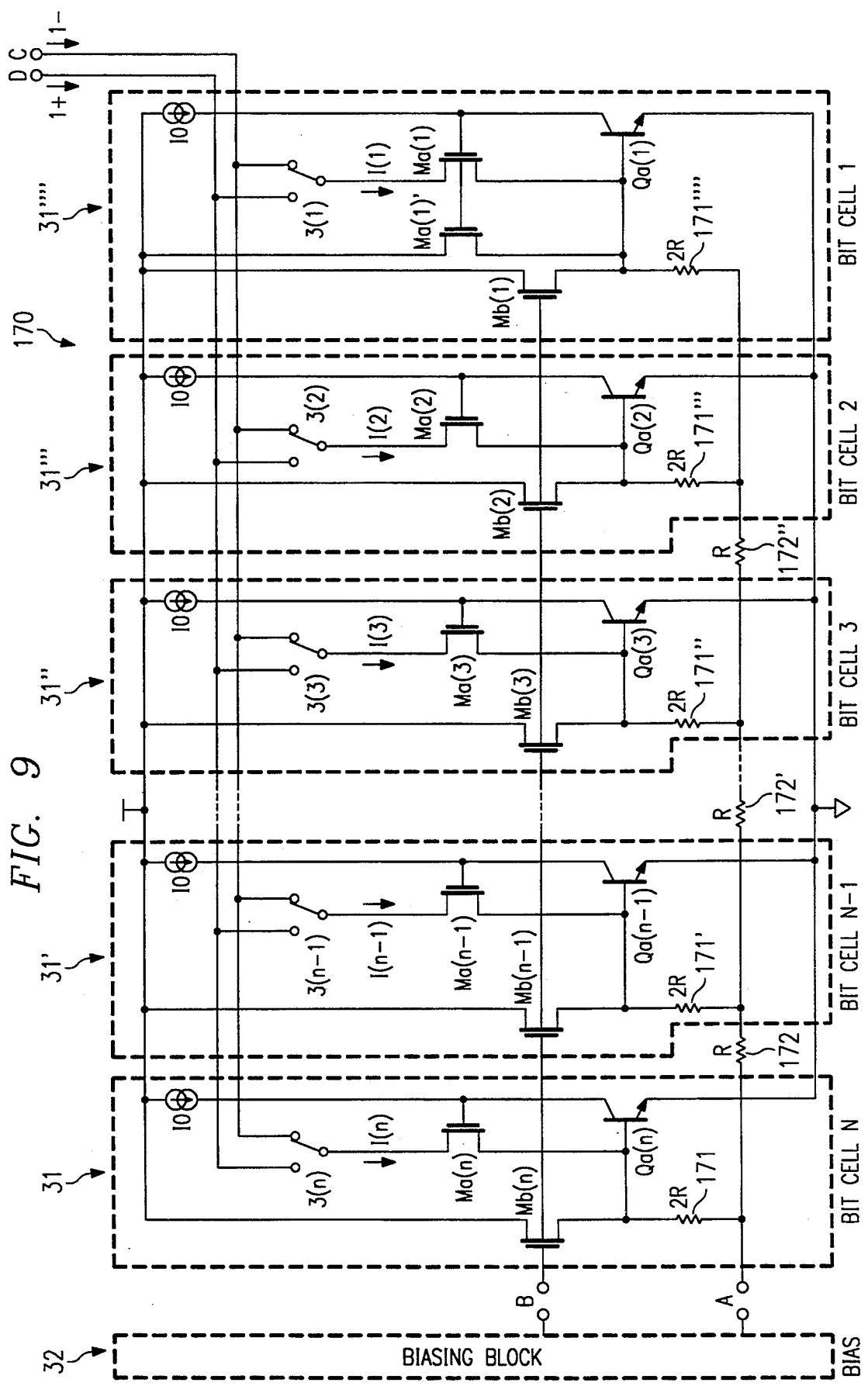

CURRENT-SUMMING DIGITAL-TO-ANALOG CONVERTER WITH BINARILY WEIGHTED CURRENT SOURCES

BACKGROUND OF THE INVENTION

1. Field of the Invention

This invention relates to improvements in digital-to-analog converters, and more particularly to improvements in digital-to-analog converters of the current-summing type in which binary weighted current sources are switched by a digital input code and summed at the same node.

2. Relevant Background

A simplified electrical schematic diagram of a typical digital-to-analog converter 10 using ratioed current sources, according to the prior art, is shown in FIG. 1. An operational amplifier 11 along with an input resistor 12 of value R0 and two reference voltages, VRF1 and VRF2, servo the current through a cascode transistor 15 to equal:

$$I_{ref} = \frac{VFR2 - VFR1}{R0}.$$

This well-known arrangement, used extensively in many state-of-the-art digital-to-analog converters, insures that the switched currents, which are summed together on summing nodes S+ and S−, are all proportional to $I_{ref}$. The summing nodes S+ and S- are connected to respective output load resistors 16 and 17 of equal value, RL. The output load resistors 16 and 17 are of the same type as the input resistor 12. Thus, the voltage difference across the output load resistors 16 and 17 forms an output that is proportional to the difference in the reference voltages, VRF2−VRF1. Choosing temperature-stable reference voltages for VRF2 and VRF1 therefore guarantees an equally stable output voltage for the digital-to-analog converter 10.

The digital-to-analog converter 10 has k cells 20, 21, ... 23, k being the number of bits of a digital input word or signal to be converted. Each bit k has a corresponding current of value $2^{(k-n)}$ $I_{ref}$ flowing from the collector of the transistor in the differential pair that is switched on in its respective cell. For correct matching, a resistor is usually connected between the emitter of each transistor, Q(k), and ground. A constant voltage drop across each resistor is chosen to be large enough to make the effect of $V_{be}$ mismatches smaller than that of mismatches between the resistors. Also, usually the resistors can be laid out with better relative accuracy than the transistors.

Each cell has a respective resistor of value $2^{(n-k)}$ R, with R chosen such that the MSB current of cell 20 is In=$I_{ref}$. To keep equal current densities in all devices, emitter area scaling is necessary in the transistors Q(k) and their corresponding cascode differential pairs. Thus, for an n bit converter, in the fabrication of the MSB cell 20, n transistors should theoretically be connected in parallel to form the transistor Q(n) and the devices of the associated differential pair; in the fabrication of the next cell 21, n-1 transistors should theoretically be connected in parallel to form the transistor Q(n-1) and its differential pair, and so on. However, as the number of bits increases, the number of transistors necessary to carry out the circuit increases geometrically, and becomes impractically high above five or six bits. This necessitates added design measures be taken to reduce the total size of the circuit.

Until now, no method that is known by applicant generates the weighted currents in a systematic way without requiring a large array of transistors with scaled emitter areas. Most existing circuits are derived from FIG. 1, and silicon area is usually kept down by series division of currents, carried out by resistive current dividers or segmented structures. Another drawback of the classical approaches is the need for an operational amplifier to generate the circuit biasing, which comes at the expense of total circuit area and speed.

SUMMARY OF THE INVENTION

Considering the above, therefore, it is an object of the invention to provide an improved digital-to-analog converter.

It is another object of the invention to provide a method for digital-to-analog conversion that generates currents that are weighted according to bit position, in a systematic way that does not require a large array of transistors with scaled emitter areas.

It is yet another object of the invention to provide a digital-to-analog converter of the type described that does not need an operational amplifier to generate circuit biasing.

These and other objects, features, and advantages will become apparent to those skilled in the art from the following detailed description, when read together with the accompanying drawings and appended claims.

According to one broad aspect of the invention, a digital-to-analog converter is presented that includes a bias block that provides first and second voltage outputs, and at least one bit cell for receiving a binary input signal. The bit cell has a switch to selectively connect either a first or a second summing node to a current flow path depending upon the binary state of the binary input signal. An output bipolar transistor and a current source are connected in series between a supply voltage and a reference potential. A first MOS transistor is connected in the current flow path with its gate connected to a junction between the current source and the bipolar transistor. A base current compensating second MOS transistor is connected between the supply voltage and the base of the output bipolar transistor with its gate connected to the first voltage output of the amplifier. A resistor is connected between the base of the output bipolar transistor and the second voltage output of the amplifier.

The number of bits of the digital signal that can be converted is determined by the number of bit cells that are provided, and, in accordance with one aspect of the invention, a plurality of bit cells are provided, arranged in a bit order. In this embodiment, the resistor each of the plurality of bit cells is sized according to a position of its associated cell in the bit order. The resistors may be sized as a power of 2 according to a position of its associated cell in the bit order, or, except for a most significant bit cell may be sized 2 times larger than the resistor of the most significant bit cell, with a plurality of resistors each of size equal to the resistor of the most significant bit cell connecting an end of a resistor of each bit cell with an end of resistor of an adjacent bit cell.

In a preferred embodiment, the bipolar transistors are NPN transistors, and the MOS transistors are n-channel MOS transistors. Also, the bias block and the at least one bit cell form a resistor ratio current amplifier. Alternatively, the bias block comprises a voltage to current amplifier or a bandgap voltage generator.

The switch may be of several forms. In one form, a pair of switch transistors are connected respectively between the first and second summing node and the current flow path, each switch transistor having a current control element connected to receive respectively an input binary signal and a complement of the input binary signal. In another form, a pair of switch transistors are connected respectively between the first and second summing node and the current flow path, the control element of one switch transistor being connected to the output bipolar transistor, and the control element of another switch transistor being connected to receive respectively an input binary signal.

According to another broad aspect of the invention, a digital-to-analog converter is presented having a bias block and a bit cell. The bias block has first and second current paths between a supply voltage and a reference potential, each having a reference current source and a bipolar transistor in series. A third current path has an MOS transistor between the supply voltage and a base of the bipolar transistor of the first current path, and a fourth current path has an MOS transistor between the supply voltage and a base of the bipolar transistor of the second current path, a gate of the MOS transistors of the third and fourth current paths being connected to a node within the second current path. A fifth current path has an MOS transistor between the supply voltage and a summation node, a gate of the MOS transistor of the fifth current path being connected to a node within the first current path. A first resistor is connected between the base of the bipolar transistor of the first current path and a summation node. A summation current source is connected between the summation node and a reference potential. The bit cell has a sixth current path between the supply voltage and the reference potential having a reference current source and a bipolar transistor in series. A seventh current path has an MOS transistor between the supply voltage and a base of the bipolar transistor of the sixth current path, the MOS transistor of the seventh current path having a gate connected to a node within the second current path. A second resistor is connected between the base of the bipolar transistor of the sixth current path and the summation node. An eighth current path has an MOS transistor between a switch node and the base of the bipolar transistor of the sixth current path, the MOS transistor of the eighth current path being connected to a node within the sixth current path, and a switch is connected to selectively connect the switch node to either a first or a second output summing node according to a state of a binary word to be converted.

In the construction of the digital-to-analog converter of the invention, preferably the reference current sources supply substantially equal currents, the bipolar transistors are NPN transistors, and the MOS transistors are NMOS transistors.

BRIEF DESCRIPTION OF THE DRAWINGS

The invention is illustrated in the accompanying drawings, in which:

FIG. 2 is an electrical schematic diagram of a current amplifier from which the digital-to-analog converter in accordance with the invention may be derived, to illustrate its principles of operation.

FIG. 3 is an electrical schematic diagram of the biasing block portion of the current amplifier of FIG. 2, juxtaposed to a bit cell circuit for generating a bit position weighted current in accordance with the invention.

FIG. 4 is an electrical schematic diagram of an alternative embodiment of the biasing block portion of the current amplifier of FIG. 2, according to the invention, using a voltage-to-current converter.

FIG. 5 is an electrical schematic diagram of another alternative embodiment of the biasing block portion of the current amplifier of FIG. 2, according to the invention, using a bandgap voltage generator.

And FIG. 9 is an electrical schematic diagram of another embodiment of a digital-to-analog converter according to the invention, that may be formed with a biasing block of FIGS. 3, 4, or 5, and a plurality of bit cells of FIG. 3.

In the various figures of the drawing, like reference numerals are used to denote like or similar parts.

DETAILED DESCRIPTION OF THE PREFERRED EMBODIMENTS

Figure 1:
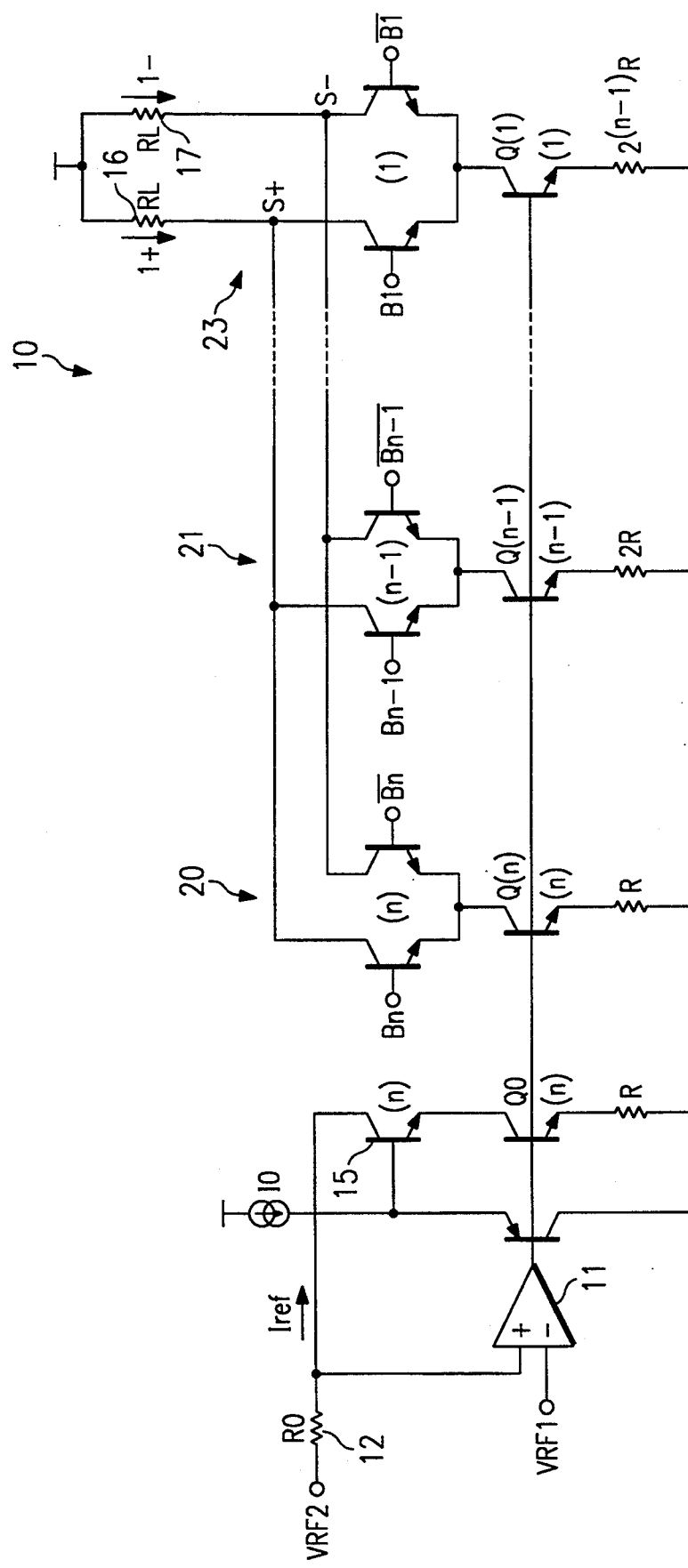
FIG. 1 is a simplified electrical schematic diagram of a typical digital-to-analog converter, using ratioed current sources, according to the prior art.

A current amplifier circuit 30 from which the digital-to-analog converter of the invention may be derived is shown in FIG. 2. The current amplifier 30 is shown having two circuit portions 31 and 32 separated by a dotted line 33. The circuit portion 32 serves as a biasing block that provides the current bias to the output circuitry. The circuit portion 31 provides the output circuitry, which will replaced by a plurality of cells for generating weighted currents according to bit position in the construction of the digital-to-analog converter of the invention, as below described.

In the embodiment shown, the transistors are NPN bipolar and n-channel MOS (NMOS) devices, although it will be appreciated that transistors of other conductivity types can be used with appropriate circuit modifications. The current amplifier 30 has an input bipolar NPN transistor 35 and an output bipolar NPN transistor 36 connected in series with respective current sources 38 and 39, each series set being connected between a supply voltage, $V_{dd}$, rail 40 and a reference potential, or ground, line 41. A third bipolar NPN transistor 44 is connected in series with a third current source 45 between the supply voltage rail 40 and ground line 41. A first base current compensating NMOS transistor 48 is connected between the supply line 40 and the base of the input transistor 35, and similarly, a second base current compensating NMOS transistor 49 is connected between the supply line 40 and the base of the output transistor 36.

A pair of resistors 50 and 51, of respective values R0 and R, are connected respectively from the bases of NPN transistors 35 and 36 to "node A", and a current source 37 that supplies a summing current, Is, is connected between node A and a voltage potential, V−. An NMOS transistor 55 is connected between the supply rail 40 and node A, the gate of the NMOS transistor 55 being connected to the collector of the input NPN transistor 35. Additionally, a base current compensating NMOS transistor 56 is connected between the supply rail 40 and the base of the NPN transistor 44. The gates of the NMOS transistors 48, 56, and 49 are interconnected on "node B", at the collector of the NPN transistor 44.

An input current source 57 supplying an input current, $I_{ref}$, is connected between the supply rail 40 and the base of the NPN input transistor 35. In a similar manner, the output current developed on terminal 58 is developed by an NMOS transistor 59 connected between the output terminal 58 and the base of the NPN output transistor 36. The gate of the NMOS transistor 59 is connected to the collector of the NPN output transistor 36.

This, and other examples of resistor ratioed current multiplier circuits are described in my copending patent application Ser. No. 08/189,102, filed Jan. 31, 1994, (Attorney docket nunmber 93-S-49), entitled "RESISTOR RATIOED CURRENT MULITPLIER/DIVIDER", said application being assigned to the assignee hereof, and incorporated herein by reference.

In operation, the current amplifier 30 is biased by the non-critical, well-matched current sources 38, 39 and 45, each supplying a current, I0. The NPN input transistor 35 is biased at I0 by NMOS transistor 55 that closes the loop between its collector and base nodes. Similarly, the NPN transistor 44 is biased at I0 by the base current compensating NMOS transistor 56. Likewise, the output transistor 36 is biased at the same current, I0, by NMOS transistor 59. Therefore, the transistors 35, 44, and 36 all have the same value of base-emitter voltage, $V_{be0}$.

Since the base of the input NPN transistor 35 is at the same voltage as the base of the NPN transistor 44, the base current compensating NMOS transistors 48 and 56 have equal gate-to-source voltages, and also have equal drain-to-source voltages, since their drains are both connected to $V_{dd}$. Thus, the base current compensating transistors 48 and 56 each conduct identical currents, both of value Ib0, the base current of the bipolar input and output transistors 35 and 44. The base current compensating NMOS transistor 48 therefore compensates for the base current of the input NPN transistor 35, and only the input current $I_{ref}$ flows through the resistor 50, creating a voltage difference R0 $I_{ref}$ between the base of the input NPN transistor 35 and node A.

The base of the input NPN transistor 35 is at the same voltage as the base of the output NPN transistor 36. Thus, the current through the resistor 51 has the value $$\frac{R0 \cdot I_{ref}}{R}.$$

This current adds to the base current of the output NPN transistor 36, from which the current flowing through the NMOS transistor 49 is subtracted. This current also equals Ib0. As a result, only the current $$\frac{R0 \cdot I_{ref}}{R}$$

flows through the NMOS transistor 59, which is connected to the output terminal 58.

The current amplifier 30 therefore generates a current that is directly proportional to the reference current $I_{ref}$, with a ratio simply given by the ratio of the two matched resistors 50 and 51. The current source 37 provides biasing for the resistors 50 and 51, as well as the NMOS transistor 55 on node A. This biasing current can be in a simple form a single resistor (not shown) of non-critical value connected between the node A and ground rail 41.

The circuit portion 31 of the current amplifier 30 can be substituted by one or more "bit cells" 60 that only require transistors of minimum emitter area, one resistor, and a switch 62 connected to summing lines C and D, as shown in FIG. 3. The switch 62 is positioned between terminal 63 or 64 depending upon the binary state of a binary word or signal to be converted. The switch 62 is preferably implemented by one or more switching transistors, as described below with reference to FIGS. 6 and 7.

The biasing block 32 offers biasing for the whole circuit at a smaller cost in silicon area than an operational amplifier, and requires no capacitor. The bit cell 60 connects to the biasing block 32 at nodes A and B at terminals 65 and 66, respectively, therefore allowing a repetitive and highly compact structure favorable to both matching and area requirements. Thus, as will become apparent, a plurality of similarly constructed bit cells may additionally be connected to the nodes A and B in a similar fashion to convert input digital signals having a corresponding plurality of bit positions.

The current amplifier portion of the digital-to-analog converter of the invention may be provided, alternatively, by a voltage-to-current converter circuit 70, as shown in FIG. 4. In the embodiment shown, the transistors are NPN bipolar and n-channel MOS (NMOS) devices, although it will be appreciated that transistors of other conductivity types can be used with appropriate circuit modifications. In the circuit 70 an input NPN transistor 71 is connected in series with a first current source 72, supplying a current I0, between a supply voltage, $V_{dd}$, rail 73 and a reference potential, or ground, rail 74. A base current compensating NMOS transistor 78 is connected between the supply voltage rail 73 and the base of the input transistor 71. A first resistor 79 of value R0 is connected between the base of the input transistor and the output node A. A current source 80 also is connected between the node A and a biasing voltage V− on terminal 81. A NMOS transistor 84 is connected between the supply rail 73 and node A, having its gate connected to the collector of the NPN input transistor 71. The input voltage $V_{ref}$ is connected on input terminal 85 via an input resistor 86, of value R1, to the base of the NPN input transistor 71.

A second NPN transistor 88 is connected in series with a second current source 89, providing a current I0, between the supply voltage rail 73 and the ground rail 74. A base current compensating NMOS transistor 91 is connected between the base of the second NPN transistor 88 and the supply voltage rail 73, and a second resistor 92, of value R1, is connected between the base of the second NPN transistor 88 and the ground rail 74.

A third NPN transistor 93 is connected in series with a third current source 94, also providing a current I0, between the supply voltage rail 73 and the ground rail 74. A base current compensating NMOS transistor 96 is connected between the base of the second NPN transistor 88 and the supply voltage rail 73, and the output node B is connected to the gate of the base current compensating NMOS transistor 96 and the collector of the third NPN transistor 93.

The circuit 70 provides biasing by the external voltage source $V_{ref}$. Therefore, the current through the first resistor 79 is:

$$\frac{V_{ref} - V_{be}0}{R1} = Ib0 + I_{78},$$

where: $I_{78} = I_{91} = Ib0 + V_{be}0/R1$, from which follows:

$$V_A = V_{be}0 - \frac{R0 \cdot V_{ref}}{R1}.$$

The circuit connects to the bit cell in the same manner as the circuit 32 described above through nodes A and B, and generates an output current in the bit cell of FIG. 3 of value:

$$R0 \cdot \frac{V_{ref}}{R1 \cdot R}.$$

An electrical schematic diagram of another alternative circuit 100 of the biasing block portion of the circuit of FIG. 2, according to the invention, uses a bandgap voltage generator, as shown in FIG. 5. In the embodiment shown, the transistors are NPN bipolar and n-channel MOS (NMOS) devices, although it will be appreciated that transistors of other conductivity types can be used with appropriate circuit modifications. The first half of the bandgap voltage generator circuit 100 has a first NPN transistor 101 connected in series with a current source 102 that supplies a current, I0. The NPN transistor 101 and current source 102 are connected between a supply voltage, $V_{dd}$, rail 104 and a reference potential, or ground, rail 105. A first base current compensating NMOS transistor 107 is connected between the voltage supply rail 104 and the base of the first NPN transistor 101. A first resistor 108 of value R0 is connected between the base of the first NPN transistor 101 and node A, and a current source 110 that supplies a current Is is connected between node A and a supply voltage V− on a terminal 111. A second NMOS transistor 113 is connected between the voltage supply rail 104 and node A, with its gate connected to the collector of the first NPN transistor 101.

A second NPN transistor 115 is connected in series with a second current source 116 that supplies a current I0, the series being connected between the voltage supply rail 104 and the ground rail 105. A base current compensating third NMOS transistor 118 is connected between the voltage supply rail 104 and the base of the second NPN transistor 115, with its gate connected to the collector of the second NPN transistor 115. A second resistor 117 of value R1 is connected between the base of the second NPN transistor 115 and the ground rail 105.

The second half of the voltage generator circuit 100 has a third NPN transistor 120 connected in series with a third current source 121 that supplies a current I0, the series being connected between the voltage supply rail 104 and the ground rail 105. A base current compensating fourth NMOS transistor 123 is connected between the voltage supply rail 104 and the base of the third NPN transistor 120, with its gate connected to the collector of the third NPN transistor 120, and to output node B.

Finally, a fourth NPN transistor 125 is connected in series with a fourth current source 126, the series being connected between the voltage supply rail 104 and the ground rail 105. A base current compensating fifth NMOS transistor 128 is connected between the voltage supply rail 104 and the base of the fourth NPN transistor 125, and a current source 129, which supplies a current Ia, is connected between the base of the fourth NPN transistor 125 and the ground rail 105.

The first and second halves of the bandgap voltage reference generator circuit 100 are interconnected by a resistor 130 between the respective bases of NPN transistors 115 and 125. In operation, the transistors 115 and 125 are biased at I0 by the NMOS transistors 118 and 128, respectively. The emitter area of the NPN transistor 125 is made n times larger that of the NPN transistor 115, so that a voltage difference of $V_t$ log(n) appears between their bases. This voltage difference creates a current across the resistor 130 equal to $$\frac{V_t \cdot \log(n)}{R2},$$

which added to the base current of the NPN transistor 115 and to $V_{be}0/R1$, flows into the NMOS transistor 118 and is mirrored by the NMOS transistor 107 into the resistor 108. The voltage drop across the resistor 108 then equals:

$$R0 \cdot \left( \frac{V_{be}0}{R1} + \frac{V_t \cdot \log(n)}{R2} \right),$$

which is the sum of:

(1) a term of negative temperature coefficient: $V_{be}0/R1$ (2) a term of positive temperature coefficient:

$$\frac{V_t \cdot \log(n)}{R2}.$$

Choosing the values of the resistors 108, 117, and 130 so that the temperature coefficients of these two terms cancel allows the voltage drop across the resistor 108 to be made a temperature-independent bandgap-like voltage, of amount required by the targeted reference current value for the bit cells.

Calculations to determine the values of the resistors result in:

$$R2 = \frac{\frac{1 + V_{be0}(T0)}{a \cdot T0} \cdot R0 \cdot V_{t0} \cdot \log(n)}{V0} \text{ and}$$

$$R1 = \frac{a \cdot T0 \cdot R2}{V_{t0} \cdot \log(n)},$$

wherein:

a (in mV/deg.) is the absolute value of the slope of $V_{be0} = f(T)$ (typically 2 mV/deg.)

T0 is a reference temperature (in Kelvin)

$V_{t0} = kT0/q$ $V_{be0}(T0)$ is a known value of $V_{be0}$ at T0

V0 is the desired temperature-stable voltage drop across R0. As an example, if:

a=2 mV/deg.
T0=300° K
$V_{t0}$=26 mV
$V_{be0}$(T0)=695 mV
V0=372 mV Then,
R0=8270 Ω
R1=28820 Ω
R2=2010 Ω.

Figure 6:
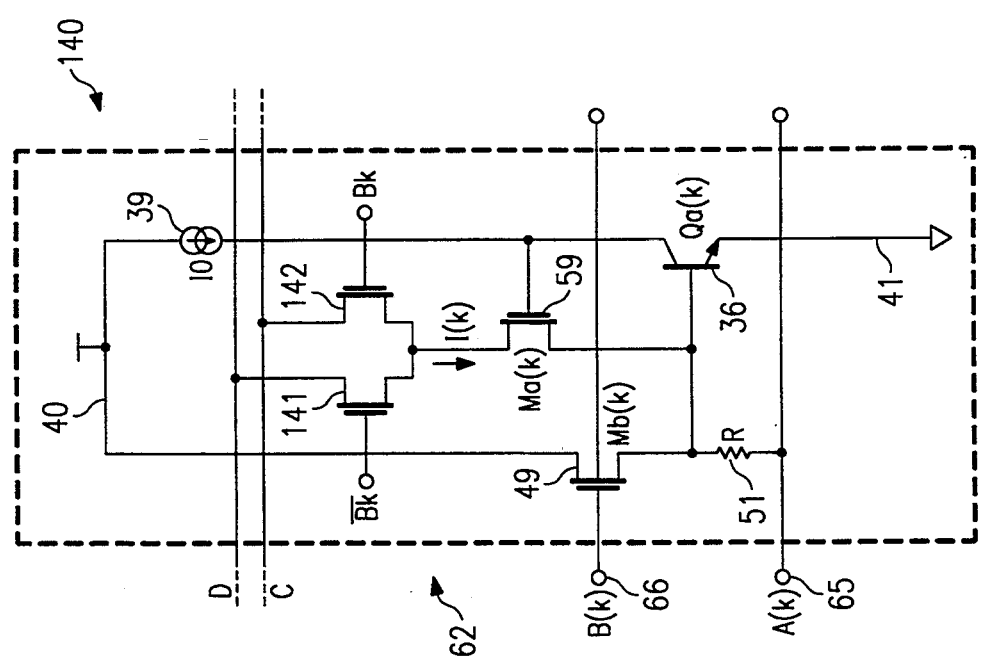
FIG. 6 is an electrical schematic diagram of one embodiment of a bit cell circuit for generating a bit position weighted current in accordance with the invention.

An electrical schematic diagram of one embodiment of a bit cell circuit for generating a bit position weighted current in accordance with the invention is shown in FIG. 6. These bit position weighted currents are referred to herein as being binarily weighted. The BICMOS circuit 140 is similar to the circuit 60 described above with reference to FIG. 3, except for the use of transistors 141 and 142 connected to serve the function of the switch 62 between the summing lines C and D and the NMOS transistor 59. In the circuit embodiment of FIG. 6, the NMOS transistors 141 and 142 switch the output current on or off for each bit cell in dependence of the state of the input signal Bk, applied to their respective gates in inverted and non-inverted form.

Figure 7:
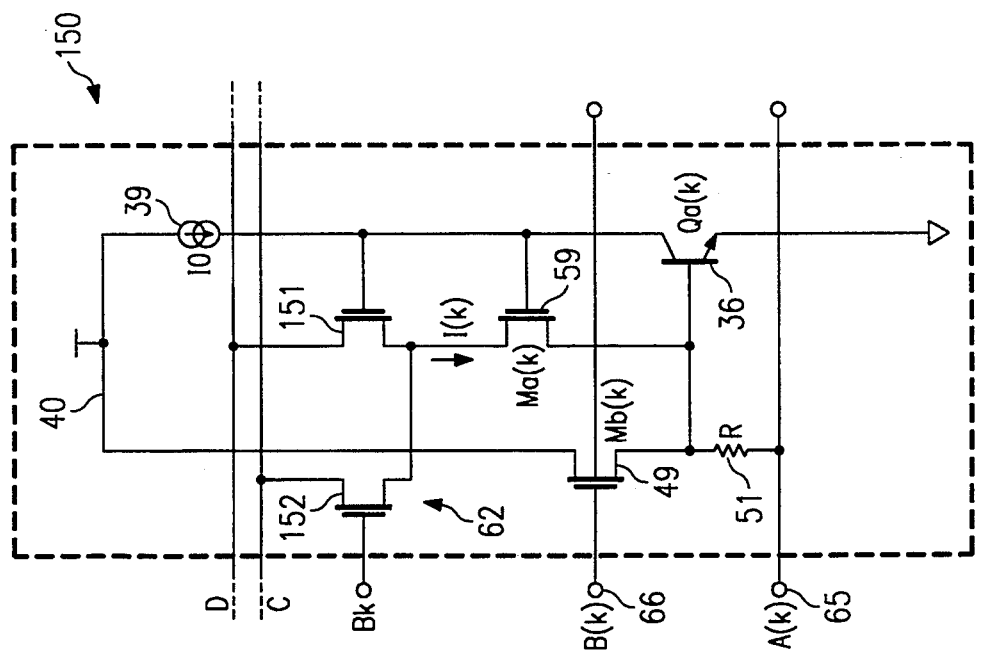
FIG. 7 is an electrical schematic diagram of another embodiment of a bit cell circuit for generating a bit position weighted current in accordance with the invention.

An electrical schematic diagram of another embodiment of a bit cell circuit 150 for generating a bit position weighted current in accordance with the invention is shown in FIG. 7. In the circuit 150, two NMOS transistors 151 and 152 are connected to provide the switch function; however, the gate of the NMOS transistor 152 is connected to the collector of the NPN transistor 36, thereby requiring only a single input signal, Bk, for operation.

Figure 8:
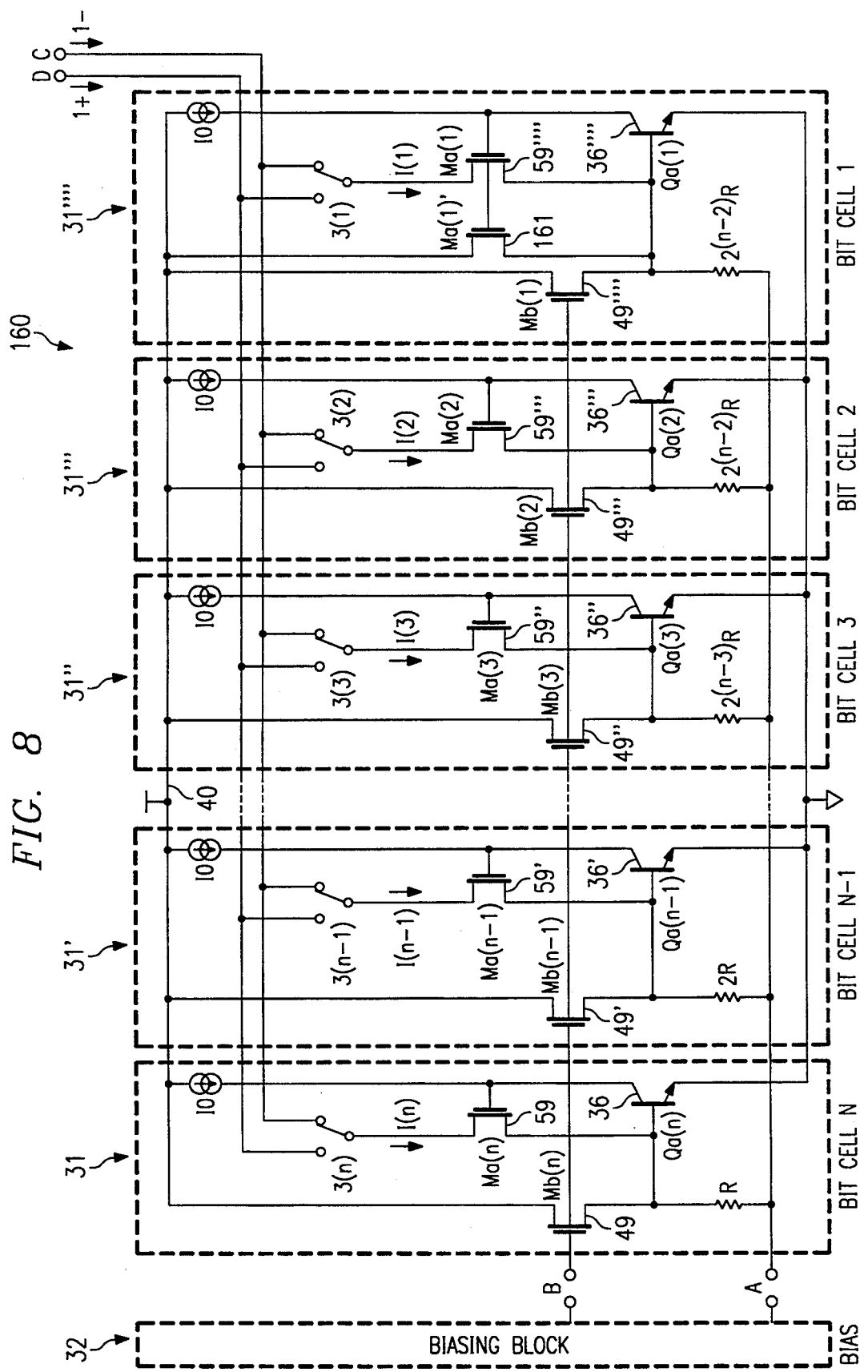
FIG. 8 is an electrical schematic diagram of a digital-to-analog converter according to the invention, that may be formed with a biasing block of FIGS. 3, 4, or 5, and a plurality of bit cells of FIG. 3.

An electrical schematic diagram of a digital-to-analog converter 160 according to the invention, formed with a biasing block of FIGS. 3, 4, or 5, and a plurality of bit cells of FIG. 3, is shown in FIG. 8. The circuit 160 is biased by a biasing block, for example, as provided by the biasing block circuit 32 described above with reference to FIG. 2. Of course, the biasing blocks 70 or 100 can be equally advantageously employed in place of the biasing block 32 described. A number, n, of bit cells 31, 31', ... 31'''' are connected to the biasing block at nodes A and B, each of the bit cells 31, 31', ... 31'''' being constructed in a manner similar to that of bit cell 31 described above with reference to FIG. 2, except the LSB cell 31''''. The LSB cell 31'''' includes an NMOS transistor 161 connected between the supply voltage rail 40 and the base of the output transistor 36''''. The gate of the NMOS transistor 161 is connected to the collector of the output transistor 36''''.

In the circuit 160, all of the bit cells connect to the same nodes A and B of the biasing block 32. The resistor of each bit cell k has a value $2^{(n-k)}$ R, where n is the number of bit cells and k is the position of the cell with respect to the MSB cell, and R is the value of the resistor of the MSB cell. All resistors of each cell in this implementation are therefore weighted according to the position of the cell with respect to the MSB cell. To avoid resistor value being too large for the least significant bits, splitting of the transistor 59'''' can help save a factor of two in the LSB resistor, the accuracy for the LSB being of lesser importance beyond a few percent.

Since the currents through the transistors 59, 59'. . . 59'''' are not equal for binarily weighted currents, some scaling of the W/L (width to length) ratios of the channels of these transistors may be needed to keep their gate-to-source voltages substantially equal. Such scaling can be done on a gross level, since a difference between the $V_{GS}$ of two successive NMOS transistors is seen at the base of the associated bipolar devices after a reduction by the gain Gm(k) r0, where GM(k) is the transconductance of the bipolar transistor and r0 is its dynamic collector impedance. Such a gain is typically 60 dB, so a 1 volt difference between two successive $V_{GS}$'s results in only a 1 mV variation of one of the $V_{be}$'s. This 1 mV error would be swamped by the effect of the resistors.

A gross scaling of the MOS devices is easily achieved at a low cost in semiconductor surface since both the W and the L can be varied to obtain the appropriate ratios. Also, it should be noted that in the various bit cells 31, 31', ... 31'''', the bipolar devices are of substantially equal size.

In the circuit 160, the various NMOS transistors 59, 59', ... 59'''' also act as cascoding devices, providing a high output impedance for each current source. The base current compensating transistors 49, 49', ... 49'''' carry only small currents for the bases of the output transistors 36, 36', ... 36'''', and, therefore, can be tailored with minimum W/L ratios. Their matching is relatively unimportant, since matching only affects very small $V_{be}$ currents that are negligible with regard to the output currents of the bit cells.

Moreover, even the various current sources providing currents I0 do not need to be precisely matched, since their mismatches will only result in small $V_{be}$ inaccuracies that the resistive network attenuates. It will be appreciated that since the arrangements of the output transistors 36, 36', ... 36'''' and the base current compensating transistors 59, 59', ... 59'''' are two-transistor, low-gain "quasi open-loop" structures, they do not require a capacitor for frequency stability and are largely unaffected by switching transients due to code changes.

An electrical schematic diagram of another embodiment of a digital-to-analog converter 170 according to the invention, formed with a biasing block of FIGS. 3, 4, or 5, and a plurality of bit cells of FIG. 3 is shown in FIG. 9. The digital-to-analog converter 170 is a generic structure using an R-2R resistor network, in which the resistors 171, 171'. . . 171'''' are made of equal value, 2R, and each cell is interconnected by a resistor 172, 172', . . . 172'' of equal value R. Instead of connecting to the same common node A, each bit cell 31, 31', ... 31'''' is connected on its node A(k) by the resistors 172, 172', . . . 172'' of an R-2R ladder to the nodes A(k-1) and A(k+1) of the preceding and following bit cells. This allows binary current ratioing without the need for too large resistor values.

It should also be noted that several R-2R networks with different resistor values can be connected in parallel to the same node A of the biasing block, or a block of bit cells with bit position ratioed resistors in parallel with another block of bit cells with an R-2R network. The conventional techniques of digital-to-analog converter design may also be applied and used in conjunction with one or another of the described structures.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A current-summing digital-to-analog converter, comprising:

a bias block that provides first and second voltage outputs;

at least one bit cell for receiving a binary input signal, including:

a switch to selectively connect either a first or a second summing node to a current flow path depending upon a state of the binary input signal;

an output bipolar transistor and a current source, connected in series on a collector node between a supply voltage and a reference potential;

a first MOS transistor connected in said current flow path, said MOS transistor having a gate connected to a junction between the current source and the bipolar transistor and a source connected to the base of the bipolar transistor;

a base current compensating second MOS transistor connected between the supply voltage and a base of said output bipolar transistor, said base current compensating second MOS transistor having a gate connected to the first voltage output of said bias block;

and a resistor connected between the base of said output bipolar transistor and the second voltage output of said bias block.

2. The digital-to-analog converter of claim 1 wherein said at least one bit cell comprises a plurality of bit cells connected in parallel and arranged in a bit order, and wherein said current sources of each respective bit cell are binarily weighted.

3. The digital-to-analog converter of claim 2 wherein the resistor of each of said plurality of bit cells having resistance according to a position of its associated cell in said bit order.

4. The digital-to-analog converter of claim 3 wherein the resistor of each of said plurality of bit cells having resistance as a power of 2 according to a position of its associated cell in said bit order.

5. The digital to analog converter of claim 3 wherein the resistor of each of said plurality of bit cells, except a most significant bit cell has a resistance 2 times larger than the resistor of the most significant bit cell, and further comprising a plurality of resistors each of a resistance equal to the resistor of most significant bit cell, each connected between an end of a resistor of each bit cell and an end of resistor of an adjacent bit cell as a R-2R network.

6. The digital-to-analog converter of claim 1 wherein said bipolar transistors are of substantially the same size.

7. The digital-to-analog converter of claim 1 wherein said bipolar transistor are NPN transistors, and wherein said MOS transistors are NMOS transistors.

8. The digital-to-analog converter of claim 1 wherein the bias block and the at least one bit cell form a current amplifier.

9. The digital-to-analog converter of claim 8 wherein the current amplifier is a resistor ratioed current amplifier.

10. The digital-to-analog converter of claim 1 wherein the bias block comprises a voltage to current converter.

11. The digital-to-analog converter of claim 1 wherein the bias block comprises a bandgap voltage generator.

12. The digital-to-analog converter of claim 1 wherein the switch comprises a pair of switch transistors connected respectively between the first and second summing node and the current flow path, each switch transistor having a current control element connected to receive respectively an input binary signal and a complement of the input binary signal.

13. The digital-to-analog converter of claim 12 wherein the pair of switch transistors are MOS transistors.

14. The digital-to-analog converter of claim 12 wherein the pair of switch transistors are NMOS transistors.

15. The digital-to-analog converter of claim 1 wherein the switch comprises a pair of switch transistors connected respectively between the first and second summing node and the current flow path, each switch transistor having a current control element, the control element of one switch transistor being connected to the output bipolar transistor, and the control element of another switch transistor being connected to receive respectively an input binary signal.

16. The digital-to-analog converter of claim 15 wherein the pair of switch transistors are MOS transistors.

17. The digital-to-analog converter of claim 16 wherein the pair of MOS transistors are NMOS transistors.

18. A digital-to-analog converter, comprising:

a bias block, including:

first and second current paths between a supply voltage and a reference potential, each having a reference current source and a bipolar transistor in series;

a third current path having an MOS transistor between the supply voltage and a base of the bipolar transistor of the first current path;

a fourth current path having an MOS transistor between the supply voltage and a base of the bipolar transistor of the second current path;

a gate of the MOS transistors of said third and fourth current paths being connected to a node within the second current path;

a fifth current path having an MOS transistor between the supply voltage and a summation node, a gate of the MOS transistor of the fifth current path being connected to a node within said first current path;

a first resistor between the base of the bipolar transistor of the first current path and the summation node; and a summation current source between the summation node and a reference potential;

a bit cell, including:

sixth current path between the supply voltage and the reference potential having a reference current source and a bipolar transistor in series;

a seventh current path having an MOS transistor between the supply voltage and a base of the bipolar transistor of the sixth current path, the MOS transistor of the seventh current path having a gate connected to a node within the second current path;

a second resistor between the base of the bipolar transistor of the sixth current path and the summation node;

an eighth current path having an MOS transistor between a switch node and the base of the bipolar transistor of the sixth current path, the MOS transistor of the eighth current path being connected to a node within the sixth current path;

a switch connected to selectively connect the switch node to either a first or a second output summing node according to a state of a binary signal to be converted.

19. The digital-to-analog converter of claim 18 wherein said reference current sources supply substantially equal currents.

20. The digital-to-analog converter of claim 18 wherein said bipolar transistors are NPN transistors.

21. The digital-to-analog converter of claim 18 wherein said MOS transistors are NMOS transistors.

22. The digital-to-analog converter of claim 18 wherein said at least one bit cell comprises a plurality of bit cells arranged in a bit order and connected in parallel.

23. The digital-to-analog converter of claim 22 wherein the resistor of each of said plurality of bit cells has a resistance according to a position of its associated cell in said bit order.

24. The digital-to-analog converter of claim 23 wherein the resistor of each of said plurality of bit cells has a resistance as a power of 2 according to a position of its associated cell in said bit order.

25. The digital-to-analog converter of claim 23 wherein the resistor of each of said plurality of bit cells, except a most significant bit cell, has a resistance 2 times larger than the resistor of the most significant bit cell, and further comprising a plurality of resistors each of a resistance equal to the resistor of said most significant bit cell, each connected between an end of a resistor of each bit cell and an end of resistor of an adjacent bit cell as an R-2R network.

26. The digital-to-analog converter of claim 18 wherein said bipolar transistors are of substantially identical size.

27. The digital-to-analog converter of claim 18 wherein said bipolar transistors are NPN transistors, and wherein said MOS transistors are NMOS transistors.

28. The digital-to-analog converter of claim 18 wherein the switch comprises a pair of switch transistors connected respectively between the first and second output summing node and the switch node, each switch transistor having a current control element connected to receive respectively an input binary signal and a complement of the input binary signal.

29. The digital-to-analog converter of claim 28 wherein the pair of switch transistors are MOS transistors.

30. The digital-to-analog converter of claim 28 wherein the pair of switch transistors are NMOS transistors.

31. The digital-to-analog converter of claim 18 wherein the switch comprises a pair of switch transistors connected respectively between the first and second output summing node and the switch node, each switch transistor having a current control element, the control element of one switch transistor being connected to the output bipolar transistor, and the control element of another switch transistor being connected to receive respectively an input binary signal.

32. The digital-to-analog converter of claim 31 wherein the pair of switch transistors are MOS transistors.

33. The digital-to-analog converter of claim 32 wherein the pair of MOS transistors are NMOS transistors.

* * * * *